United States Patent [19]
Coppero et al.

[11] Patent Number: 5,389,928
[45] Date of Patent: Feb. 14, 1995

[54] PROCESS FOR THE D/A CONVERSION OF SIGNED BINARY CODES OF A BI-POLAR, TIME-VARYING SIGNAL AND A DIGITAL-TO-ANALOG CONVERTER EMPLOYING THIS PROCESS

[75] Inventors: Luciana Coppero, Pavia; Franco Maloberti, Torre d'Isola PV; Giuseppe Palmisano, Pavia, all of Italy

[73] Assignee: Italtel Societa Italiana Communicazioni, S.P.A., Milan, Italy

[21] Appl. No.: 955,758
[22] PCT Filed: Jun. 4, 1991
[86] PCT No.: PCT/EP91/01044
  § 371 Date: Dec. 28, 1992
  § 102(e) Date: Dec. 28, 1992
[87] PCT Pub. No.: WO92/00631
  PCT Pub. Date: Jan. 9, 1992

[30] Foreign Application Priority Data
Jun. 28, 1990 [IT] Italy ................. 20796 A/90

[51] Int. Cl.$^6$ .................................. H03M 1/76
[52] U.S. Cl. ............................. 341/150; 341/144
[58] Field of Search ............ 341/144, 145, 150, 153, 341/154, 138, 148

[56] References Cited
U.S. PATENT DOCUMENTS

| | | | |
|---|---|---|---|
| 4,618,852 | 10/1986 | Kelley et al. | 341/138 |
| 4,661,802 | 4/1987 | Yukawa | 341/153 |
| 4,665,380 | 5/1987 | Lewyn | 341/150 |
| 4,973,979 | 11/1990 | Ikeda | 341/154 |

OTHER PUBLICATIONS

Proceedings of the IEEE 1989, Custom Integrated Circuits Conf., May 15–18, 1989, Castello et al., "Analog Front-End of an ECBM Transceiver for ISDN".

*Primary Examiner*—Howard L. Williams

[57] ABSTRACT

The process for the conversion of a digital code involves the construction of two positive unipolar voltages (Vo+, Vo−) ranging between the analog ground level (Vgnd) and an upper full scale level (Vref), and the shifting downward of the second one (Vo−) of these voltages by a quantity equal to its maximum range, so to obtain two unipolar voltages (Vo+, Vo−) and with an amplitude equal to the halved module of the final stage.

7 Claims, 6 Drawing Sheets

PROCESS FOR THE D/A CONVERSION OF SIGNED BINARY CODES OF A BI-POLAR, TIME-VARYING SIGNAL AND A DIGITAL-TO-ANALOG CONVERTER EMPLOYING THIS PROCESS

DESCRIPTION

The present invention concerns a procedure for the conversion of digital codes, and more in particular of signed binary codes, that is codes where the word is made of N bits, one of which constitutes the sign bit.

The invention concerns also a digital-to-analog converter having high resolution and operation frequency higher than one MHz, in particular a two-phase converter where the more significant bits of the code word are converted first, and the less significant ones thereafter.

This converter is preferably of the single supply type and suitable to integration in CMOS technology.

A two-phase or two-step digital-to-analog converter using a mixed technique (resistive-capacitive) is known, where the decoding of the more significant M bits is made through a voltage demultiplexing or a "potentiometric" conversion, while the remaining less significant K bits are decoded with a charge switching technique.

Generally, a fully potentiometric converter employs a resistive network (or resistor string) consisting of $2^N$ elements (where N is the number of bits) operating as a stepping potentiometer, supplied at the ends by two reference voltages Vref+ and Vref−, whose different voltage levels are selected by a switch decoding matrix, controlled by the bits to be decoded.

Such an architecture enables one to obtain a very high conversion speed, but is practicable only for low resolutions. For the number of bits equal to 8 it presents, in fact, some drawbacks due to the complexity of the voltage divider and of the switching logic needed. With 8 bits it is necessary to employ a resistive string consisting of 256 definite elements, whose implementation in the integrated form turns out to be difficult since it involves the covering of a large area on the chip, and furthermore the accuracy required for the string elements is critical.

A conversion circuit with a full charge switching topology employs a binary weighted capacitor matrix sequentially injecting, in the virtual ground of an operational amplifier, a charge quantity proportional to a reference voltage and to the digital input word.

Even this conversion technique shows some drawbacks when the resolution increases since, for a comparatively high number of bits (8–10), it requires a great number of capacitive values.

This involves, besides a considerable area increase, a slowing down of the slew rate of the amplifier and a decrease of the gain-bandwidth figure, placing an upper limit on the operation frequency in the range of several hundred MHz.

The mixed architecture represents, therefore, a good compromise for the realization of average resolution converters (9–11 bit) having a conversion speed of several MHz.

The advantage as for resolution arises from the fact that the first M bits are intrinsically monotonic, while the capacitor matrix has to a meet a matching and a monotonic accuracy equal to K bits only to perform an M+K bit conversion. However, as the required resolution increases, that is as the number of bits forming the code increases, this technique is subject to the troubles mentioned above for each one of the two conversion types.

The object of the present invention is to further improve the resolution which can be obtained with this mixed architecture (that is, to increase the total number of bits forming the binary code) while limiting the drawbacks mentioned above for the two conversion techniques, when the bit number increases.

This object is achieved with the present invention, which consists of a process for the conversion of a binary digital signed code made of N bits, one of which represents the sign, characterized by the following steps:

a. constructing two positive voltages (Vo+, Vo−) between the analog ground level and an upper full scale level, the maximum range of each one of these voltages being equal to ¼ of the peak-to-peak voltage to be reconstructed;

b. shifting downward the second one of these voltages by a quantity equal to its maximum amplitude, so to obtain two voltages, the first of which never has negative polarity, while the second one never has positive polarity, one-half of the amplitude of each being equal to one-half amplitude of the final voltage;

c. obtaining the algebraic difference of these two voltages, with the sign bit determining which one of the two voltages is the minuend versus the subtrahend.

The invention consists also in a digital-to-analog converter having a fully differential structure, including a resistive string for the decoding of the more significant M bits and matrix of binary weighted capacitors AC divided into two branches, the common plate of each branch being connected to one of the inputs of a differential amplifier, while the other plates of the capacitors can be alternatively connected either to one constant voltage pair or to a pair of voltages which depend on the configuration of the less significant K bits, characterized by the fact that said resistive string includes $2^M/2$ resistive elements of equal value, whose ends are connected to an upper reference voltage and to an analog ground voltage which form the previously said constant voltage pair, and by the fact that the capacitor plates of one branch can be selectively connected to a first voltage pair identified by the more significant (M−1) bits on the resistive string, while the plates of the other branch can be selectively connected to a second voltage pair, symmetrical of said first voltage pair, with respect to the middle of the resistive network.

Further advantageous characteristics form the object of the remaining claims.

The invention shall now be described more in detail making reference to the preferred, but not limiting, embodiments shown in the enclosed drawings, where.

The conversion procedure shall now be described referring to FIGS. 7A–7C for a preferred application, that is, for a D/A conversion implemented with a differential topology.

Figure 7A:
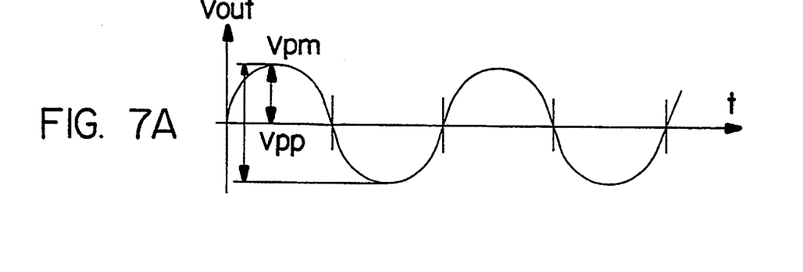
FIGS. 7A to 7C show the conversion procedure referring to an example.

Let's assume, for simplicity, that the voltage to be reconstructed at the output end is a sinusoid Vout having peak-to-peak amplitude Vpp (equal to two times the maximum peak value, Vpm) as shown in FIG. 7A. Assuming an input digital word made of N bits, a conventional conversion procedure would require, for the decoding of a signal having such a dynamic range, $2^N$ conversion weights or voltage levels ranging between a negative full scale Vref− and a positive full scale Vref+.

The procedure according to the invention employs, on the contrary, only $2^{N-1}$ weights or voltage levels (that is one half that of the conventional procedure), between an analog ground level of the signal, marked Vgnd, and the positive full scale level of the signal, hereafter called Vref.

Figure 7B:
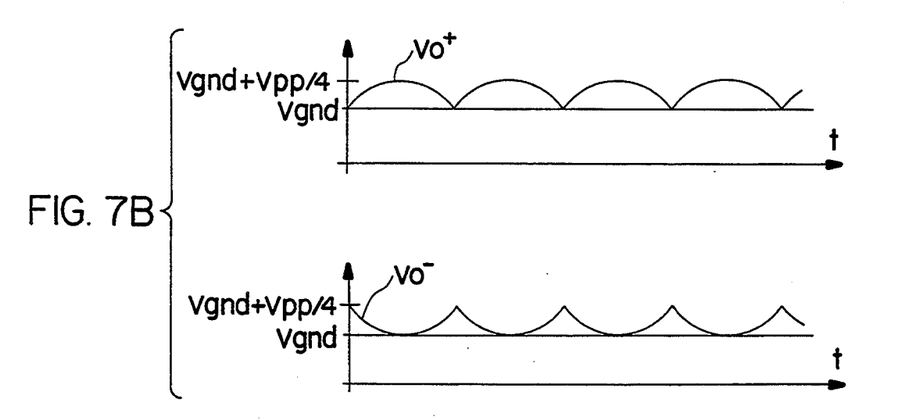

The first conversion step is the construction of two voltages, labelled Vo+ and Vo− in FIG. 7B ranging between Vgnd and Vref, and therefore always positive, the maximum amplitude of each being equal to Vpp/4.

Figure 7C:
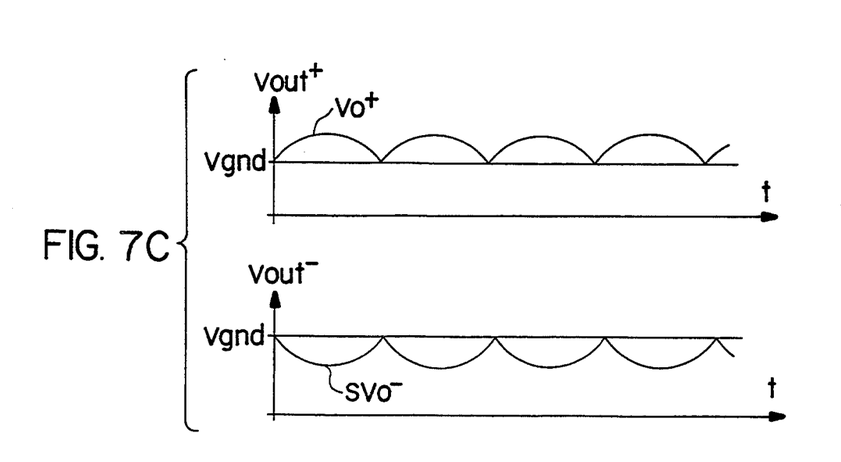

The second step is the shifting downward of voltage Vo− by an amount equal to Vpp/4, thus obtaining two voltages Vo+, SVo− as shown in FIG. 7C. The first voltage Vo+ never has negative polarity, while the second voltage SVo− never has positive polarity, and each have both amplitudes equal to one-half that of the final voltage to be reconstructed. According to the procedure of the invention, the construction of the two voltages Vo+ and SVo− is independent of the sign bit.

The final output voltage is therefore obtained as the algebraic difference between these two voltages, with the sign bit for the signal to be reconstructed determining which one of the two voltages represents the minuend versus the subtrahend. In the half cycle during which the output sinusoid Vout must be positive, SVo− is subtracted from Vo+, while in the other half cycle the inverse operation is made, that is [(SVo−)−(Vo+)].

The procedure, as better described below, is particularly advantageous when applied to a mixed, two-phase conversion architecture where the more significant M bits are decoded in one of the two phases with a potentiometric arrangement, while the remaining K bits are decoded in the other phase through a switched capacitor structure. In that case, in fact, the number of elements of the resistive string is halved, and the shifting of the waveform Vo− is simply obtained by varying the reference level at which a capacitor matrix is precharged.

The selection of the final voltage polarity is simply made by inverting the connection of two sample and hold blocks placed downstream of the two voltages Vo+ and Vo−, while the difference between these two voltages is intrinsic to the circuit differential structure.

Figure 8:
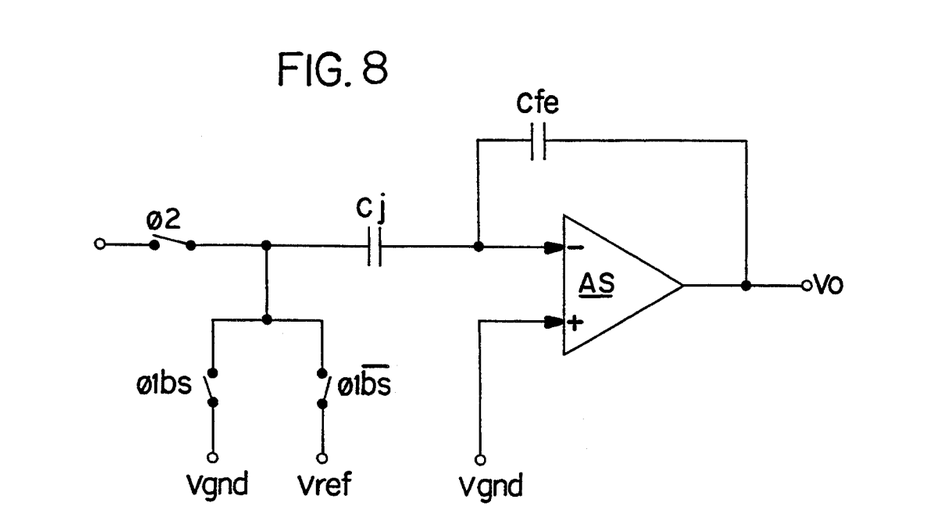
FIG. 8 shows a schematic variant of the converter employing a single ended circuit.

The procedure according to the invention is applicable even to a single-ended circuit structure. In that case the analog voltage is obtained utilizing the conversion weights ranging between Vgnd and Vref, thus obtaining the module of the final sinusoid, that is a waveform having maximum amplitude equal to Vpp/2. When the sign bit is negative, the voltage waveform is shifted by a quantity equal to Vpp/2, obtaining a two-polarity final signal compared to the analog ground level. A schematic structure of this arrangement is shown in FIG. 8 and shall be described later.

Furthermore, the procedure according to the invention is applicable also to an analog-to-digital conversion. In that case, the shifting of the input analog voltage made accordingly to its polarity is performed using a switched capacitor structure. It enables one even in this case to save the silicon area since it halves the number of comparison elements required to code the signal.

Therefore, with the procedure according to the invention, the number of resistive components is reduced on one hand, and on the other hand neither additional components nor is an additional phase signal required for the shifting. Thus, the proposed procedure enables a circuit simplification. While the conventional conversion procedure requires three reference generators: one for the analog ground, one for the positive full scale and one for the negative full scale, the procedure according to the invention enables the negative full scale voltage reference to be completely eliminated.

The invention shall now be further described in detail referring to a preferred embodiment of digital-to-analog converter shown in the figures.

Figure 1:
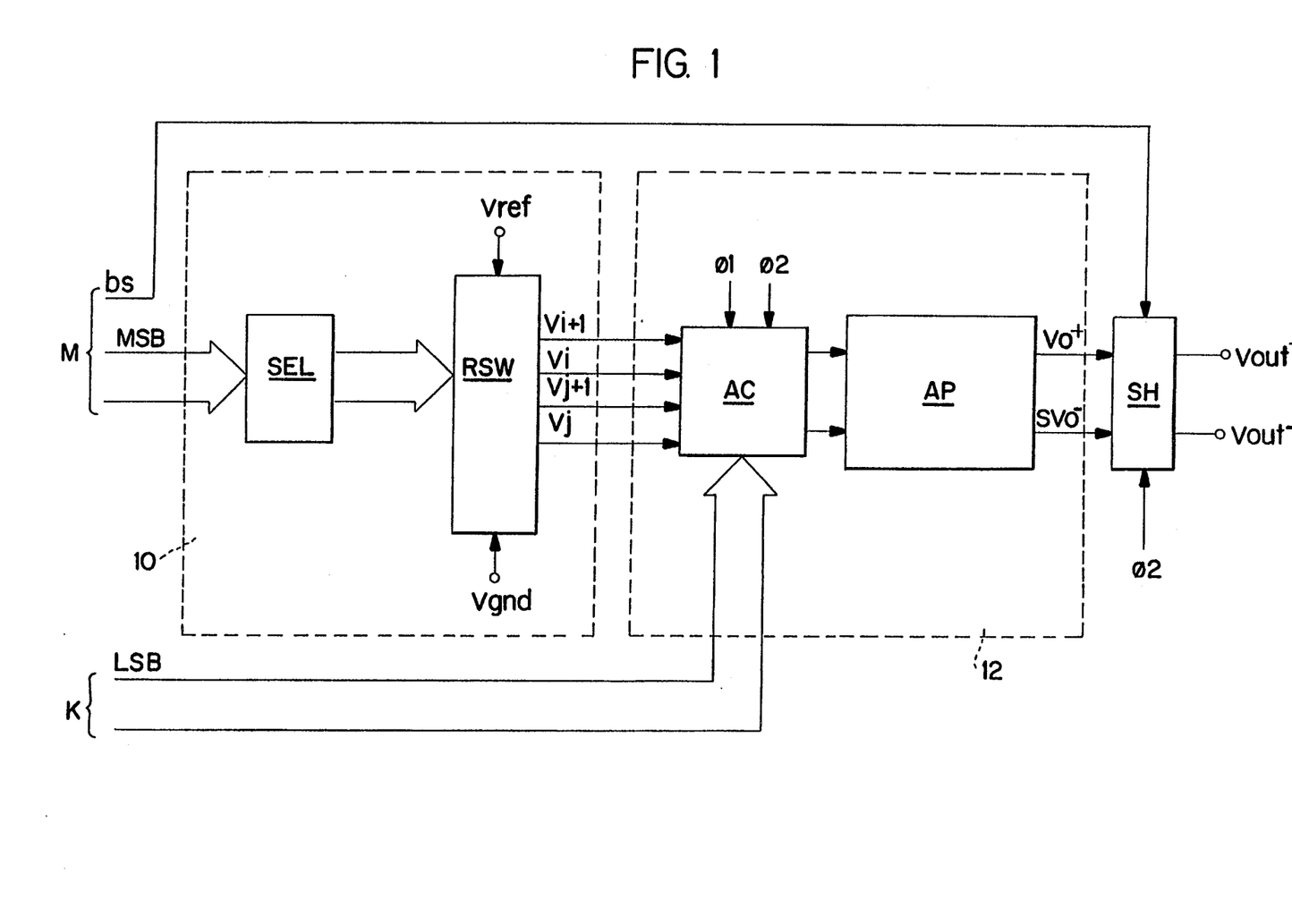
FIG. 1 is a general block diagram of a digital-to-analog converter of the fully differential type employing the procedure according to the invention.

Referring to FIG. 1, the converter according to the invention includes a first portion 10 for the conversion of the more significant bits (MSB), M, and a second portion 12 for the conversion of the less significant bits (LSB), K, of a code word formed of M+K bits.

Portion 10 involves a resistive string arrangement, consisting of a resistive string RSW (called also a resistive ladder), a switch matrix, and a selector SEL controlling the turning on and off of switches accordingly to phases which depend on the values of the bits to be decoded. The resistive string is supplied by a reference voltage Vref and by an analog ground voltage Vgnd, for instance 3.5 and 2.5 V, respectively, in case of 5 V supply and of an output dynamic specification equal to 2 V.

According to the input configuration of the (M−1) MSB, the RSW arrangement produces at the output a voltage level pair identifying the ends of the interval in which the output voltage shall be included. More particularly, due to the differential structure of the converter, voltage pairs Vi+1 and Vi, Vj+1 and Vj shall be supplied at the output, symmetric compared to the middle voltage level VM between Vref and Vgnd.

Figure 5:
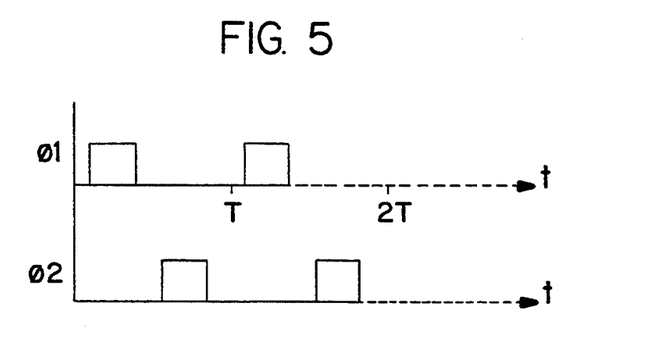
FIG. 5 shows $\Phi 1$ and $\Phi 2$ phase signals.

The second portion 12 for the conversion of the less significant K bits LSB, which takes place in the second clock half-cycle, includes a matrix or array of capacitors AC, supplied by RSW output voltages and controlled at the input by LSB bits and by two phase signals $\Phi 1$ and $\Phi 2$, shown in FIG. 5.

The outputs of the capacitor matrix are connected to the inputs of an operational amplifier AP. Outputs Vo+ and Vo− of the operational amplifier AP are connected to a sample and hold circuit SH under the control of the $\Phi 2$ phase signal, and the converted differential analog signals Vout+ and Vout− are available at the outputs of this last block.

Figure 2A:
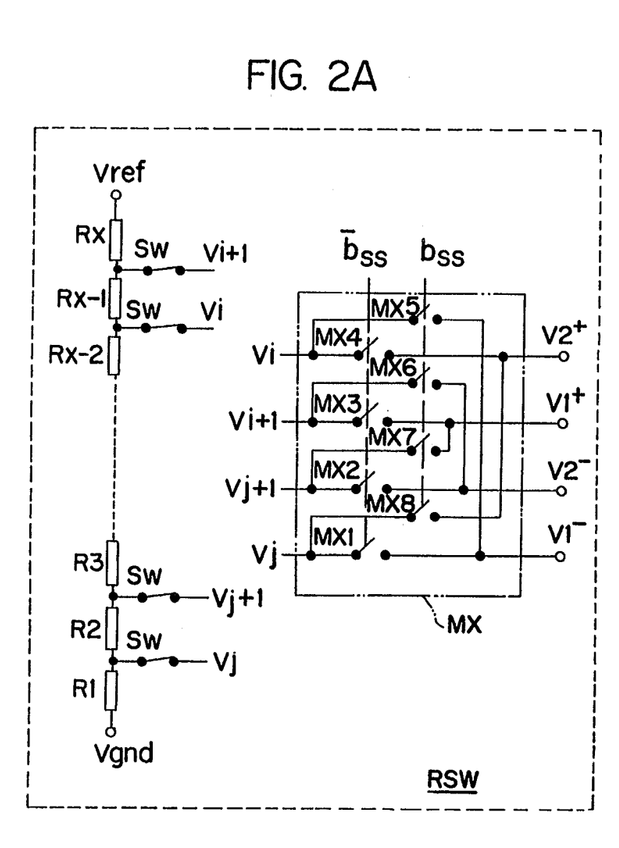
FIGS. 2A and 2B show the structure of the resistive string and the structure of the charge switching conversion circuit of the converter of FIG. 1, respectively.

Analog voltages at the outputs of the differential amplifier AP are available only during the useful phase Φ2 and it is therefore necessary to put a circuit in cascade therewith to perform the reading operation of the voltages during the Φ2 phase and to maintain these voltages during the subsequent phase (phase Φ1 of the subsequent conversion cycle). As shall be explained more in detail later, two sample and hold blocks are actually implemented, and the sign bit $b_s$ of the word to be decoded controls the connection between the operational amplifier and the circuit SH. FIG. 2A, showing the RSW structure more in detail, shows also some of the resistances forming the ladder according to the invention, made with the resistive elements R1, R2, ... Rx-2, Rx-1, Rx.

All the ladder resistances have a value equal to R which represents the minimum resistive element and are $2^{M-1}$ in number, that is one-half of the resistive strings of the known technique. As a consequence, the ladder shall be called hereafter half-string.

The ends of the half-string are connected to the Vref voltage and to the Vgnd analog ground to which the sign of the output analog voltage is referred, respectively.

With known arrangements, labelled in FIG. 2A as SW switches, the more significant bits MSB select two voltage pairs Vi+1, Vi and Vj+1, Vj on the half-string.

Through a switching circuit MX, including switches of known type and controlled by the $b_{ss}$ bit having the more significant weight immediately subsequent to the sign bit, the two voltage pairs Vi+1, Vi and Vj+1, Vj are selected from the string by the selector SEL on the basis of the more significant bits (and therefore independent on the sign bit $b_s$) and are made available to the capacitor matrix which is part of the AC structure.

The MX circuit thus establishes the correct connection with the voltages of the two pairs, which are now indicated by V1+, V2+ and V1− and V2− as shall be discussed later.

Figure 2B:
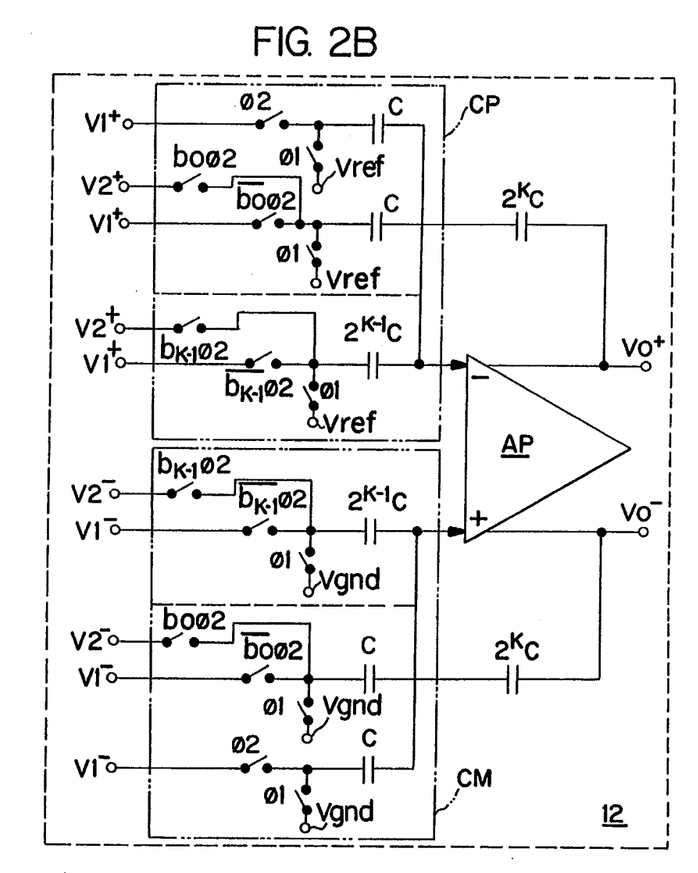

FIG. 2B shows more in detail the structure of the capacitor matrix AC including two portions or branches, indicated by CP and CM, whose outputs supply the non-inverting input and the inverting input of the differential amplifier AP, respectively. Outputs Vo+ and SVo− of the differential amplifier AP are connected to the corresponding inputs through capacitors having a capacity of $2^K C$, where K is the number of LSB bits.

Each one of the CP and CM branches includes a series of capacitors with a value equal to C, C, 2C, 4C ... $2^{k-1}C$, connected in parallel, each having the common top plate connected to the corresponding input of the operational amplifier AP. The bottom plate of the capacitors is selectively connected, through electronic switches controlled by signals enabled during the phase φ2, to one of the four voltages belonging to the two pairs V1+, V2+ and V1−, V2−.

More particularly, the voltages of the pair V1+, V2+ are supplied to the CP branch of the capacitor matrix, while those of the pair V1−, V2− and supplied to the CM branch of the capacitor matrix following the methods which shall be detailed below.

As it can be seen in FIG. 5 showing a simplified diagram of phases Φ1 and Φ2 within the conversion time T, Φ1 is at high logic level in the first half of the clock cycle during which the MSB conversion takes places through the selection operated by the SEL block and by the MX block of the different voltage levels available on the half-string. The Φ2 phase is at high logic level in the second half of the clock time during which the LSB conversion, described hereafter, occurs.

As it can be seen in FIG. 2B, in the upper branch CP the switches driven by signals during control phase Φ1 connect the CP branch capacitors to the Vref voltage, that is to the positive full-scale voltage, while the switches driven by signals during control phases Φ2, boΦ2, and (bk−1) Φ2 versus boΦ2 and (bk−1)Φ2 (during the time in which Φ2 is high) connect a given capacitor in the CP branch either to V1+ or V2+ voltage, respectively, depending on the logic status of the j-th bit belonging to the less significant K bits set.

A capacitor of minimum value equal to C is always connected during phase Φ2 to the lowest voltage between those selected (that is always to V1+) in order that the minimum voltage output from the amplifier AP is equal to $$\left[ \frac{((2^k - 1) \cdot C)}{2^k} + \frac{C}{2^k} \right] V1+$$

that is, equal to V1+, whichever is the less significant digital word present at the converter input.

Similarly, in the lower branch CM, the switches driven by the control phase Φ1 connect the capacitors in the CM branch to the Vgnd voltage (that is to the analog ground voltage), while the switches driven by the control phases Φ2, boΦ2, (bk−1) Φ2 versus boΦ2, b(k−1)Φ2 connect the capacitor either to V1− or to V2−, respectively, accordingly to the status of the j-th bit belonging to the set of the less significant bits LSB.

A capacitor of minimum value C is always connected, during the time in which Φ2 is high, to the minimum voltage between V2− and V1− (that is always to V1−) for the same reasons described for the capacitor of minimum value belonging to the upper branch CP, that is, to complete the charge injection proportional to V1− whatever is the input digital word.

The operation of the converter according to the invention shall now be described making reference to FIGS. 3 and 4.

Figure 3A:
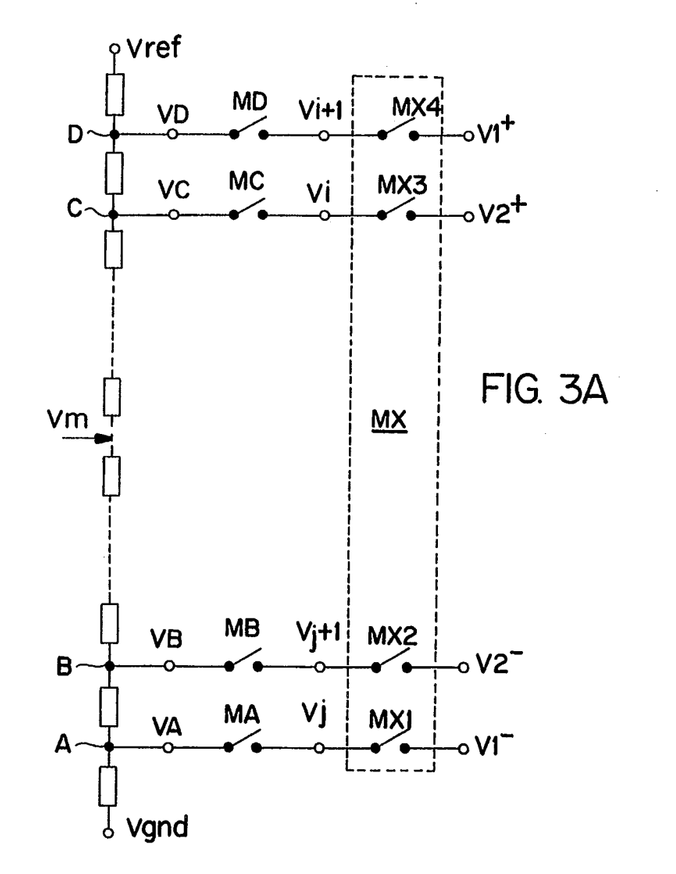
FIGS. 3A and 3B show, for example's sake, the selection of the string voltage levels for two particular input words.
Figure 3B:
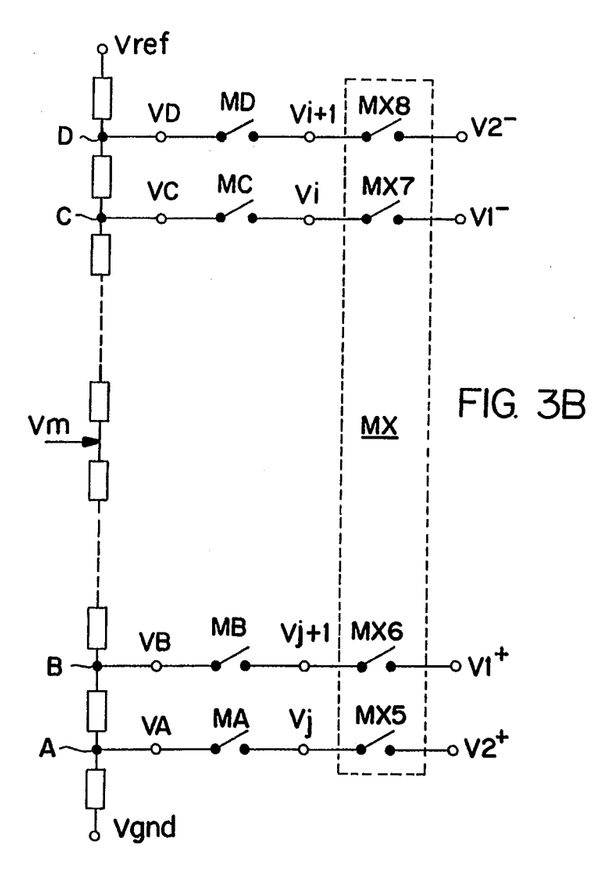
Figure 4:
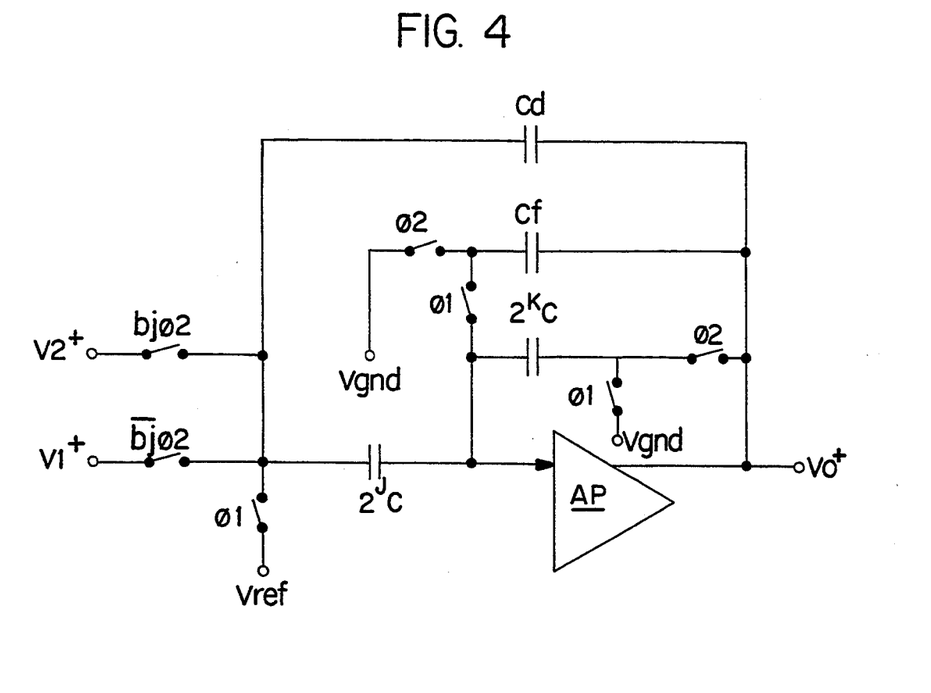
FIG. 4 is a circuit diagram of a preferred configuration of the switched capacitor structure according to the invention.

FIGS. 3A and 3B better show the selection of the levels on the half-string. Let's assume that the input digital word corresponds to a voltage level included in the voltage interval identified by the two successive taps A and B on the half-string.

This level is higher than Vgnd and lower than the middle voltage Vm of the half-string as indicated in FIG. 3A. During the first half of the clock period, the selector SEL activates the clock controls which turn off switches MA and MB making available the ends Vj and Vj+1 of the voltage interval within which the output voltage shall be included. At the same time SEL activates the turning on of switches MC and MD which make available the voltage levels corresponding to the ends of the voltage interval symmetrical to the previous one compared to level Vm.

In this hypothesis, the $b_{ss}$ bit is equal to 0, therefore the block MX closes switches MX1, MX2, MX3 and MX4 and determines the relation Vj=V1−, Vj+1=V2− connecting therefore taps A and B of the half-string to the bottom plates of the capacitors forming the matrix of branch CM.

During the phase Φ2 the capacitors perform the injection of a charge proportional to said voltages, taking Vgnd as reference level (that is the voltage at which they were connected during the previous Φ1 phase).

This injection consists in the flow of positive charge through the feedback capacitor $2^k C$ giving rise to an output voltage Vo− lower than Vgnd, that is, a negative voltage.

At the same time the block MX also performs the connection Vi=V2+ and Vi+1=V1+. The matrix capacitors belonging to the branch CP are so connected during Φ2 to taps D and C of the half-string. Their reference value is equal to Vref (voltage at which they were connected during phase Φ1). Their switching on V1+ and V2+ thus gives rise to the injection of a negative charge which, flowing through the capacitor towards the output Vo+, produces a voltage higher than Vgnd on said output, that is, a positive voltage.

If, letting the other bits remain unchanged, it is assumed that bss=1, the selector SEL activates the same control phases closing the same switches MA, MB, MC and MD.

The block MX receives therefore the same voltage at the input end, however, it turns on the switches MX5, MX6, MX7 and MX8 and establishes a new configuration setting Vi=V1−, Vi+1=V2−, Vj=V2+, Vj+1=V1+. Taps C and D are therefore connected to the capacitors of branch CM and taps A and B to those of the branch CP.

Voltages Vo+ and Vo− have the same polarity as before but higher amplitude, having now to construct an output analog voltage having amplitude ranging between Vc and Vd by subtraction.

This arrangement for the conversion of the MSB allows one to simplify the logic circuitry forming the SEL block in order to minimize the number of phases converging on switches connected to each tap of the half-string and the number of the switches themselves.

Making reference to FIG. 4, structures AC and AP of FIG. 1, performing the LSB conversion shall now be described more in detail. For simplicity sake, we shall describe only the upper branch CP, and the matrix of these capacitors is represented in brief, highlighting a generic capacitor of the matrix itself, indicated by $2^j C$.

The switched capacitor structure of the previous FIG. 2B described the capacitive elements useful for the injection and integration of the charge, that is the charge proportional to the code and to the reference voltages. FIG. 4 shows now in more detail a preferred structure adopted in the invention, including also the capacitors Cd and Cf, the role of which shall be described later on.

During phase Φ1, the input capacitor $2^j C$ and the feedback capacitor $2^k C$ discharge the charge they stored during the previous conversion cycle.

Thanks to the inverting structure, only the charge required to update the offset voltage present at the input of the operational amplifier flows through the parking capacitor Cf. The input matrix and the feedback capacitor always hold charge with opposite sign and equal value.

During the successive phase the input capacitor $2^j C$ is connected to the higher or to the lower voltage of the available pair V1+ and V2+, the connection being determined by the bit of weight j.

If, for instance, all LSB are equal to zero, then all the capacitors of the upper matrix are connected to V1+ causing a flowing of charge through each capacitor $2^j C$ which originates an output amplitude Vo+ equal to [(Vref)−(V1+)] referred to Vgnd.

At the same time, all the capacitors of the lower matrix CM, the switching of which is driven by the same less significant bits, are connected to V1−, giving rise to a negative output level (compared to Vgnd) equal to [(V1−)−(Vgnd)].

Since V1− and V1+ were symmetrical on the half-string with respect to the middle level Vm, the two differential voltages corresponding to the input code have been constructed. It must be noted that up to now the conversion procedure (and therefore the circuit components implementing it) is independent of the sign bit $b_s$. The information related to $b_s$ is processed at this stage of the conversion operation.

Figure 6:
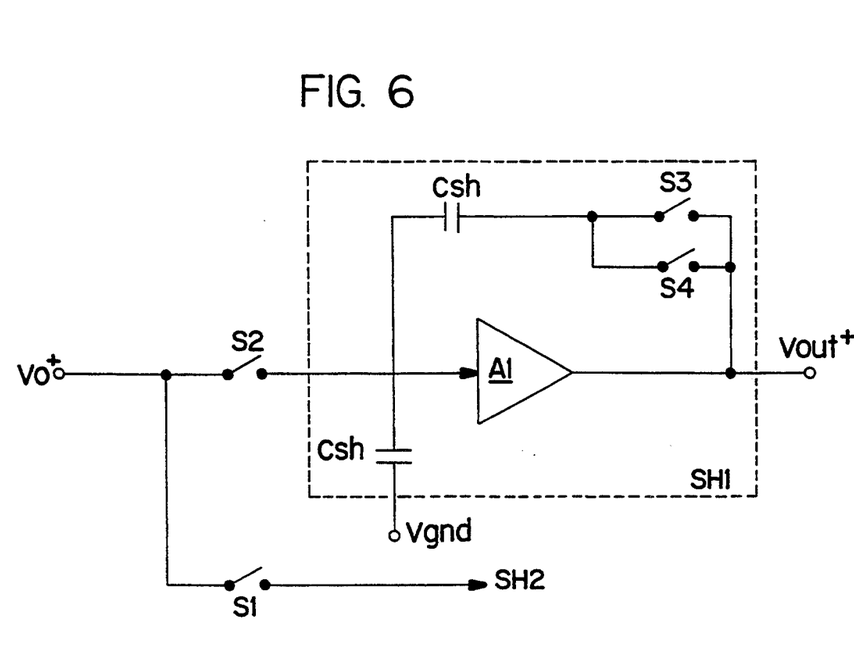
FIG. 6 shows the structure of one of the two portions forming the sample and hold (SH) block.

As explained before, it is necessary to sample the signals Vo+ and Vo− of the amplifier AP during the phase Φ2 and hold them until the phase Φ2 of the subsequent conversion period is on. This operation is performed through two sample and hold blocks SH1 and SH2 (indicated by SH as a whole in FIG. 1), only one of which is shown in FIG. 6. This block includes an amplifier A1, two capacitors Csh and the switches S1–S4 controlled by signals derived from Φ1 and Φ2 and from the $b_s$ sign bit.

If the sign bit is negative, the connections between these two blocks and the outputs Vo+ and Vo− of the differential amplifier AP are reversed, thus performing the inversion of the final analog voltage. In other words the conversion of the sign bit just involves the addition of two switches.

The advantages of the newly proposed conversion procedure are fully applied by the two-phase mixed architecture described, representing the currently preferred realization form of the invention.

The halving of the number of components of the resistive string involves a savings in the silicon area which is particularly manifest when the required linearity is high, and this leads to the use of polysilicon integrated resistors, which present a low specific resistance.

The reduction in the string extension gives rise to a better resistive matching (at equal technological characteristics) and consequently to a better absolute linearity.

The selection logic which results is simpler and the differential topology, in addition to the known intrinsic advantages of better power supply noise rejection, represents a more simple and direct implementation of the proposed conversion procedure.

It must be noted that the selection logic could have been further simplified if, on one of the two branches CP or CM, the role of phases Φ1 and Φ2 were exchanged, performing therefore the connection to the taps of the half-string during phase Φ1, and the reading discharging operation during phase Φ2. According to this possibility, the differential voltages Vout+ and Vout− could be constructed using the same levels on the half-string, that is by selecting one single voltage pair on the string.

However, the configuration here proposed allows one to obtain a great advantage when combined with a compensation procedure of the clockfeedthrough effect, which procedure forms the object of another patent application deposited by the Applicant, under the title "Procedure for the compensation of the clockfeedthrough effect in switched capacitor circuits".

As already known, opening a switch originates a phenomenon of parasitic charge injection which, in high impedance nodes (for instance the virtual ground of an operational amplifier), gives rise to an error voltage or clockfeedthrough voltage.

The proposed inverting configuration enables one to open before the useful phase (phase Φ2) only those switches which are biased at reference voltages and not at signal voltages.

The injection of parasitic charge which arises following this switching is therefore constant for any input digital word. The clockfeedthrough voltage is, moreover, a common mode voltage (even if, in part, due to mismatches between the two paths) and is therefore partially rejected by the common mode rejection in the differential amplifier stage.

The connection of capacitors to the half-string only during the second half of the clock period, when the digital portion (selector SEL, which switches on the half-string sockets, block MX) has completed its transitions, avoids the direct coupling of switching noise coming from the digital portion.

The reduction of the noise from the direct coupling of the switches connecting the outputs Vo+ and SVo− to the two blocks SH, and of the residual clockfeedthrough effect can be accomplished by applying the compensation technique forming the object of the above mentioned patent application, reference to which has to be made for further details.

The switched capacitor structure presents further considerable advantages which shall be described in brief below, with reference to FIG. 4.

The offset voltage (that due to mismatch between the two amplification paths of the differential amplifier), is stored by the input capacitors ($2^jC$) and by the feedback capacitor ($2^kC$) during the phase Φ1, in such a way that the charge injection into virtual ground during the successive phase Φ2 is independent of the offset voltage. Moreover the dc transmission zero so obtained by this configuration allows one to limit the equivalent input noise $1/f$ of the operational amplifier.

The parasitic capacitances existing between the plates of the integrated capacitors and the substrate do not affect the charge injection since the injection and integration capacitors present one plate which always is connected to the virtual ground, and the other plate is switched between low impedance points.

During the offset reading phase, the operational amplifier is closed in feedback through Cf which is charged at the signal voltage stored during the previous Φ2 phase. This prevents the outputs from going again to the analog ground level, as would happen if the amplifier, during Φ1, were closed in a unit feedback configuration through a switch. Large output swings would bring about a high slew rate.

The $C_f$ capacitor, besides limiting the slew rate time of the operational amplifier, allows one to compensate the incomplete discharge error due to the fact that the operational amplifier gain is of high but finite value.

Finally the capacitor Cd prevents large output fluctuations which could occur during the interval between phases Φ1 and Φ2 (during which time the amplifier would be in open loop but for Cd). These fluctuations could involve an increase in the slew rate time.

FIG. 8 shows the diagram of the arrangement relative to a single-ended conversion which is useful, for instance, when there is no severe S/N ratio requirement. This presents a simpler structure compared to the differential one, and therefore covers a smaller area on the chip.

In this case one input of the operational amplifier AS is connected to the analog ground voltage Vgnd, and the other input is alternatively connected to the signal and to one of Vgnd or Vref voltages, depending on the sign bit of the code word. This is obtained through the switches shown in FIG. 8 which are controlled by the sign bit $b_s$. The output voltage Vo, present on the single terminal and referred to ground, is obtained by using as reference: Vgnd, if it is negative ($b_s=1$ makes the related switch closed during phase Φ1); and Vref, if it is positive. The Vo voltage has module equal to Vpp/2 if Vpp is the peak-to-peak amplitude of the sinusoid to be reconstructed.

Although the invention has been described with reference to the preferred embodiments, the scope of the invention should extend to cover implicit variants, modifications and adaptations which would be apparent to the technician in this field.

We claim:

1. A process for the digital-to-analog conversion of signed binary code words representing voltage samples of a bipolar time-varying signal to be reconstructed, wherein the more significant bits of the code word are converted first and the less significant ones thereafter, said process comprising the following steps:

a. constructing two positive voltages (Vo+, Vo−), each being a function of time and ranging between the analog ground level (Vgnd) and the upper full scale level (Vref), the maximum amplitude of each of these voltages being equal to ½ of the maximum peak value (Vpm) of the signal to be reconstructed, the first voltage (Vo+) values being obtained as the sum of said analog ground level (Vgnd) with the analog signal corresponding to the code obtained by disregarding the most significant bit of the code word, and the second voltage (Vo−) values being obtained as the difference between said upper full scale level (Vref) and the analog signal corresponding to the code obtained by disregarding the most significant bit of the code word;

b. shifting downward the second one (Vo−) of these voltages, by a quantity equal to its maximum amplitude (½Vpm), so as to form a voltage SVo− and thus obtain two voltages (Vo+ and SVO−) that are symmetric with respect to said analog ground level (Vgnd);

c. forming the algebraic difference between said two voltages that are symmetric with respect to said analog ground level (Vo+, SVo−) with the sign bit of the code word determining which voltage is the minuend versus the subtrahend in order to reconstruct the original bipolar time-varying signal.

2. A process according to claim 1, wherein said bipolar time-varying signal to be reconstructed is a symmetrical wave form and said maximum amplitude (Vpm) is equal to ½ of the peak-to-peak value (Vpp) thereof.

3. A process according to claim 1 or 2, applied to a mixed conversion device wherein the signed code word comprises N bits, wherein only $2^{N-1}$ conversion weights are employed, and wherein the sign bit ($b_s$) is decoded separately from the remaining bits.

4. A process according to claim 3, characterized by the fact that said level shifting of the second voltage (Vo−) is obtained by changing the reference level of an input terminal in a charge switching structure of the differential type.

5. A fully differential digital-to-analog converter, said converter including:
- a resistive string for the decoding of the more significant bits (MSB) M providing for a plurality of intermediate taps;
- switch matrix means, responsive to the configuration of the less significant bits K, for selectively connecting voltages tapped from said resistive string to voltage outputs;
- and a matrix of binary weighted capacitors for the decoding of the less significant bits (LSB)K, wherein said matrix is divided into two branches (CP, CM), and in each branch one plate of each of the capacitors is connected together and forms one input to a differential amplifier (AP), while the other plate of the capacitors is alternatively connected to either a constant voltage or to voltages depending on the output of said tap voltage switch matrix means;
- wherein said resistive string (R1, ..., Rx) includes $2^M/2$ resistive elements of equal value, which ends are connected to an upper reference voltage (Vref) and to an analog ground voltage (Vgnd) forming said pair of constant voltages,
- and wherein the plates of the capacitors of one branch (CP) are selectively connected to a first pair of voltages (V1+, V2+) identified by the M-1 more significant bits of the resistive string, while the plates of the other branch are selectively connected to a second pair of voltages (V1−, V2−) which are symmetric of said first pair of voltages with respect to the middle point of the resistive network, said first and second pairs of voltages being available at the output of a matrix of switches (MX) controlled by the first bit ($b_{ss}$) of the M more significant bits (MSB), and the inputs of said matrix being connected to the intermediate taps of said resistive string,
- whereby at the outputs of said differential amplifier (AP) said voltages Vo+, SVo− are present and said outputs are selectively connected to a sample and hold circuit (SH) under control of the sign bit ($b_s$) to carry out said algebraic difference.

6. A digital-to-analog converter according to claim 5, wherein each one of said branches (CP, CM) comprises a set of capacitors the values of which are C, C, 2C, 4C, ..., $2^{k-1}C$ respectively.

7. A digital-to-analog converter of the type including a resistive string for the decoding of the (M−1) more significant bits (MSB) of signed binary code words and a binary weighted capacitor matrix for the decoding of the K less significant bits (LSB) of said code words, comprising: said capacitor matrix being connected at one end to one input of a differential amplifier (AS) with the other input of said differential amplifier being grounded, and said capacitor matrix being alternatively connected in sequence at the other end thereof to an input signal and, depending on the sign bit of the code word, to one of the voltages Vgnd or Vref;
- wherein said resistive string (R1, ... Rx) includes $2^M/2$ resistive elements of equal value, which string ends are connected to an upper reference voltage (Vref) and to the analog ground voltage (Vgnd) forming said constant voltage pair, and wherein switches, controlled by the sign bit (bs) of the code word, are provided for connecting the capacitor plates to one or to the other of Vref or Vgnd.

* * * * *